United States Patent
Pao (10) Patent No.: US 10,958,212 B2
(45) Date of Patent: Mar. 23, 2021

(54) ELECTRICAL CONNECTION SUPPORT ASSEMBLY AND METHOD OF USE

(71) Applicant: Frank C Pao, Boston, MA (US)

(72) Inventor: Frank C Pao, Boston, MA (US)

(*) Notice: Subject to any disclaimer, the term of this patent is extended or adjusted under 35 U.S.C. 154(b) by 139 days.

(21) Appl. No.: 16/000,123

(22) Filed: Jun. 5, 2018

(65) Prior Publication Data

US 2019/0372517 A1    Dec. 5, 2019

(51) Int. Cl.
| | |
|---|---|
| H02S 40/34 | (2014.01) |
| H02G 3/08 | (2006.01) |
| H01R 43/26 | (2006.01) |
| H05K 7/10 | (2006.01) |
| H01R 13/514 | (2006.01) |
| H01R 31/02 | (2006.01) |
| H01R 13/66 | (2006.01) |

(52) U.S. Cl.
CPC ........... *H02S 40/34* (2014.12); *H01R 13/514* (2013.01); *H01R 43/26* (2013.01); *H02G 3/081* (2013.01); *H05K 7/10* (2013.01); *H01R 13/6641* (2013.01); *H01R 31/02* (2013.01)

(58) Field of Classification Search
CPC .... H01R 13/514; H01R 43/26; H01R 13/665; H01R 13/6641; H01L 31/2013; H01L 31/0201; H02S 40/34
See application file for complete search history.

(56) References Cited

U.S. PATENT DOCUMENTS

| | | | |
|---|---|---|---|
| 8,113,853 B2 * | 2/2012 | Coyle, Jr. | H02S 40/345 439/482 |
| 9,866,169 B1 * | 1/2018 | Li | H02G 3/03 |
| 9,985,580 B2 * | 5/2018 | Gingrich, III | H01L 31/049 |
| 2008/0011348 A1 * | 1/2008 | Aoyama | H02S 40/345 136/244 |
| 2012/0033392 A1 * | 2/2012 | Golubovic | H02S 40/34 361/752 |

* cited by examiner

*Primary Examiner* — Renee S Luebke
*Assistant Examiner* — Paul D Baillargeon
(74) *Attorney, Agent, or Firm* — Cohen IP Law Group, PC; Michael N. Cohen (57) ABSTRACT

An assembly to electrically attach equipment is provided. The assembly may include a junction box and the equipment may include solar panels. The junction box may include a housing with side openings through which interconnecting conductors may pass through and into an inner cavity within the box. The housing also may include bottom openings through which conductors from the solar panel may pass through and into the inner cavity within the box. Within the cavity, the junction box may include flat conductive plates to which the ends of the conductors are electrically connected. In this way, a set of junction boxes may be used to electrically connect a group of solar panels in series. Each junction box may also include a diode configured between its flat conductive plates.

20 Claims, 6 Drawing Sheets

ELECTRICAL CONNECTION SUPPORT ASSEMBLY AND METHOD OF USE

COPYRIGHT STATEMENT

This patent document contains material subject to copyright protection. The copyright owner has no objection to the reproduction of this patent document or any related materials in the files of the United States Patent and Trademark Office, but otherwise reserves all copyrights whatsoever.

FIELD OF THE INVENTION

This invention relates to the electrical connection between solar panels. More particularly, this invention relates to a junction box that facilitates the electrical connection between solar panels.

BACKGROUND

The installation of solar panels onto residential and commercial buildings has become commonplace. However, installing the solar panels onto the buildings may sometimes be difficult.

Once the solar panels are physically installed, the panels may need to be electrically configured with one another in order to form a series of panels. Accordingly, the terminals of the adjacent panels may need to be electrically connected. Given the fact that the solar panels may be mounted on a sloping rooftop, the wiring of the panels together may be difficult and even unsafe.

In addition, there may be local, state and federal regulations that must be adhered to while installing the solar panels.

Accordingly, there is a need for an electrical support assembly that may adhere to the local, state and federal regulations, and that provide for the easy electrical connection and installation of the solar panels.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE PRESENTLY PREFERRED EXEMPLARY EMBODIMENTS

The term "mechanism," as used herein, refers to any device(s), process(es), service(s), or combination thereof. A mechanism may be implemented in hardware, software, firmware, using a special-purpose device, or any combination thereof. A mechanism may be integrated into a single device or it may be distributed over multiple devices. The various components of a mechanism may be co-located or distributed. The mechanism may be formed from other mechanisms. In general, as used herein, the term "mechanism" may thus be considered shorthand for the term device(s) and/or process(es) and/or service(s).

In general, the assembly 10 provides a housing that may support and protect electrical connections between components, devices or elements using electrical wires, cables, lines, tabbing wires and other types of transmission devices. The housing may be an enclosure, box, case, frame, guard, cover, bracket, cabinet, container or other type of device or mechanism or any combination thereof. The transmission devices may transmit energy (e.g. electricity), communication signals, or other types of transmissions or combinations of transmissions.

In one exemplary embodiment hereof, the assembly 10 may be a junction box that may support, secure and protect the connections of electrical cables and wires between electrical components. The junction box may include openings and built-in terminals to facilitate the joining of the cables and wires. The junction box may also provide a protective enclosure to seal or otherwise protect the terminals, cables, wires and junctions therein.

Referring now to FIGS. 1-6, the assembly 10 according to exemplary embodiments hereof will be described in further detail. In a presently preferred implementation, the assembly 10 may be a junction box 12 that may facilitate, support, secure and protect the electrical connections of electrical cables and wires between photovoltaic panels 100 (also referred to as solar panels 100). In a preferred implementation, the solar panels 100 may be connected in series and the junction box 12 may facilitate the electrical connection between each adjacent (or otherwise positioned) solar panel 100 in the series. As is known in the art, a solar panel 100 may be formed of one or more solar cells that together may form the solar panel 100 (also referred to as a solar module 100). The solar cells may be electrically connected or otherwise configured together to form the solar panel 100. Each solar panel 100 may generally include a positive terminal (+) and a negative terminal (−). The solar panels 100 may each receive sunlight and transform it into electricity. The electricity may be gathered from each solar panel 100 and stored in an energy storage device (such as a rechargeable battery).

The solar panels 100 may preferably be configured in series so that the electricity generated by each solar panel 100 may be added together and stored in the energy storage device. To connect the solar panels 100 in series, the positive terminal (+) of a first solar panel 100 may be electrically connected to the negative terminal (−) of a second solar panel 100 (preferably adjacent or in close proximity to the first solar panel 100). Then, the positive terminal (+) of the second solar panel may be electrically connected to the negative terminal (−) of a third solar panel 100, and so on, until all of the solar panels are connected in series. The group of electrically connected solar panels 100 (also referred to as a solar array) may then typically be electrically connected to an energy storage device such as a rechargeable battery. As described herein, the junction box 12 may facilitate the electrical series connections between the series of solar panels 100.

In one exemplary embodiment hereof, the photovoltaic panels 100 may include Sunslates™ photovoltaic panels, cells, slates and products as described in U.S. Pat. No. 5,990,414, the entire contents of which are hereby fully incorporated herein by reference for all purposes. The solar panels may also include any other types of solar panels, units or components, and it is understood by a person of ordinary skill in the art, upon reading this specification, that the assembly 10 is not limited in any way by the type, types or combination of types of solar panels or other equipment that may be configured and utilized with the assembly 10.

Figure 1:
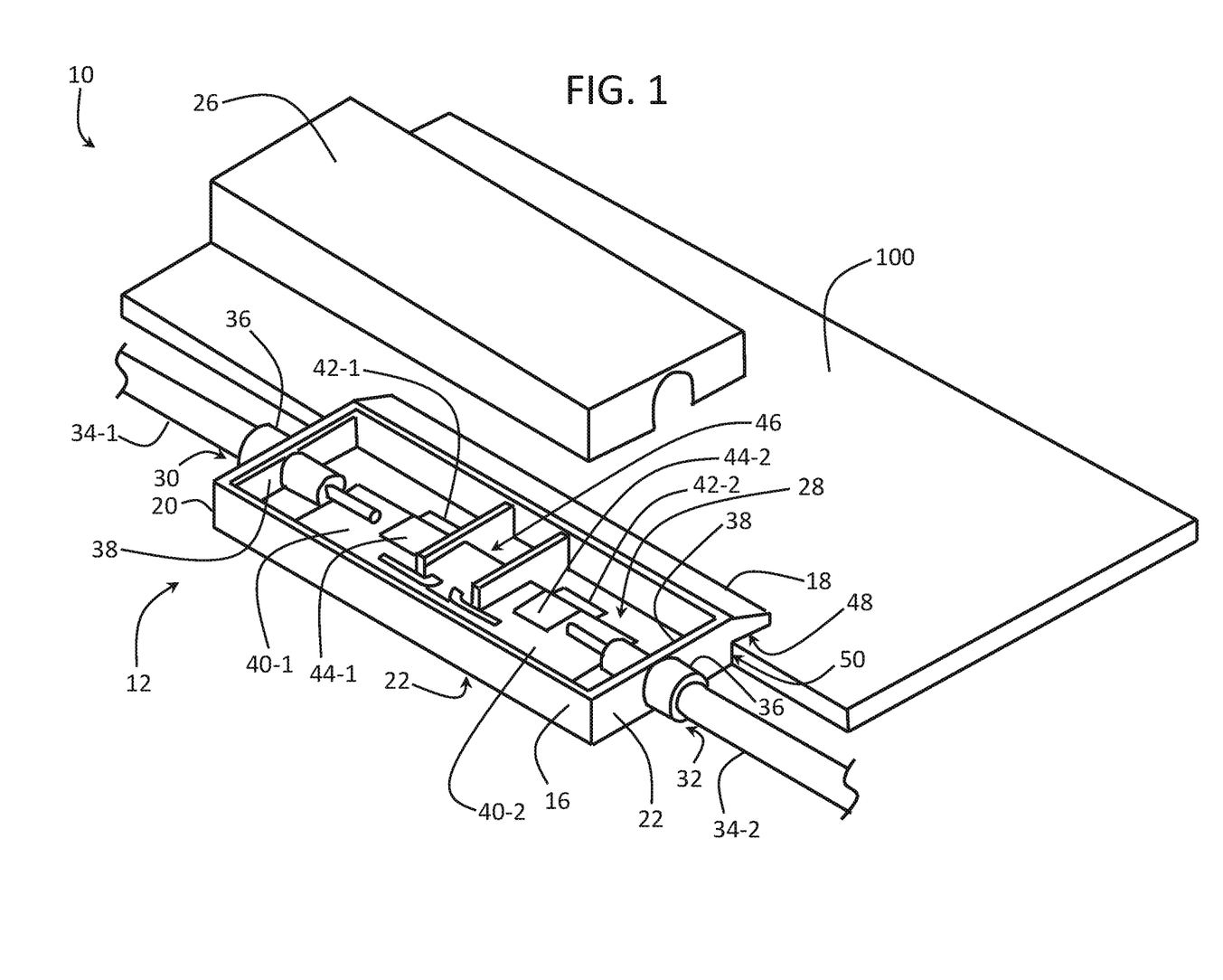
FIGS. 1-3 show aspects of an assembly according to exemplary embodiments hereof.
Figure 4:
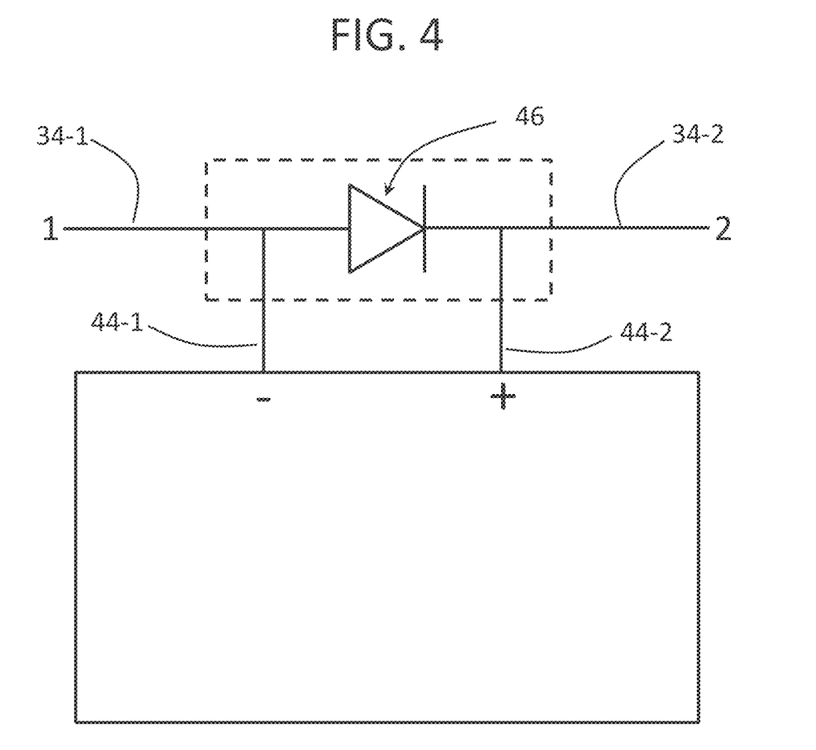
FIG. 4 depicts an electrical schematic showing aspects of an assembly according to exemplary embodiments hereof.

Turning to FIG. 1, the junction box 12 may include a body 14, a front side 16, a back side 18, a left side 20, a right side 22, a bottom 24 and a top 26. The body 14 may include at least one inner cavity 28 that may include components necessary for the junction box 12 to perform its functionality as described below. Note that while the junction box 12 shown in FIG. 1 may be generally depicted as a rectangular shaped housing, the junction box 12 may include any shape or combination of shapes, and the scope of the assembly 10 is not limited by the shape of the assembly 10. As shown, the junction box 12 may be configured with at least one solar panel 100. Note that the solar panel 100 shown in FIGS. 1 and 4 are meant for demonstration purposes and may not represent the actual size, shape or form of the solar panels 100 used in practice.

In one exemplary embodiment hereof, the left side 20 of the junction box 12 may include a left opening 30, and the right side 22 of the junction box 12 may include a right opening 32. The left opening 30 may allow for the cable 34-1 to pass from outside the junction box 12 into the inner cavity 28 of the junction box 12, and the right opening 32 may allow for the cable 34-2 to pass from outside the junction box into the inner cavity 28 of the junction box. Note that while the example shown in FIG. 1 shows the openings 30, 32 on the left and right sides respectively, the openings 30, 32 may be on any sides or combination of sides of the junction box 12.

The openings 30, 32 may each include a reinforcement shell 36 that may extend outward from the left and right sides of the box 12 and generally encircle at least a portion of the outer circumference of the openings 30, 32. The openings 30, 32 may pass through the reinforcement shells 36 while being supported therein. In this way, the reinforcement shells 36 may provide lateral support to the cables 34-1, 34-2 when the cables 34-1, 34-2 are configured with the junction box 12. Note that it may be preferable for the cables 34-1, 34-2 to include an outer insulation sheath, jacket or cover so that the inner conductor of the cables 34-1, 34-2 may be protected from the outside elements and to ensure that the conductors do not come into contact with a conducting material and be shorted. In this case, it may be preferable that the openings 30, 32 have a diameter that may allow for the cables 34-1, 34-2 (including their outer protective coverings) to pass through the openings 30, 32. In a preferable embodiment, the fitting between the cables 34-1, 34-2 and the openings 30, 32 may be snug and free of gaps or disjoints.

A crimper mechanism 38 may be configured on each inner wall surrounding the openings 30, 32. The crimper mechanisms 38 may include metal crimper springs or other types of crimping mechanisms 38. The crimpers 38 may each be securely configured on the inner walls surrounding each opening 30, 32 such that the each crimper 38 may securely grip a portion of each cable 34-1, 34-2 respectively as the cables pass into the inner cavity 28 of the junction box 12. It may be preferable that the crimpers 38 grip a substantial portion of the circumference of the cables 34-1, 34-2 and hold them secure. It may be preferable that the crimpers 38 grip the outer insulated coating of the cables 34-1, 34-2 but not penetrate the coatings far enough to come into contact with the conducting element within each cable 34-1, 34-2. In this way, each cable 34-1, 34-2 may be held secure while configured with the junction box 12.

The inner cavity 28 of the junction box 12 may include at least one conducting plate 40. In a preferred embodiment, the inner cavity 28 may include two conducting plates 40-1, 40-2 (individually and collectively 40), one configured generally on the left and one configured generally on the right. The conducting plate(s) 40 may act as conducting terminals. The left conducting plate 40-1 may be positioned generally flat across the bottom of the cavity 28 such that at least a portion of the left conducting plate 40-1 may be positioned in close proximity to (e.g. beneath) the end of the cable 34-1 that may pass into the junction box 12 through opening 30. The right conducting plate 40-2 may be positioned generally flat across the bottom of the cavity 28 such that at least a portion of the right conducting plate 40-2 may be positioned in close proximity to (e.g. beneath) the end of the cable 34-2 that may pass into the junction box 12 through opening 32. Note however that the conducting plates 40 may be configured anywhere within the junction box 12.

Figure 2:
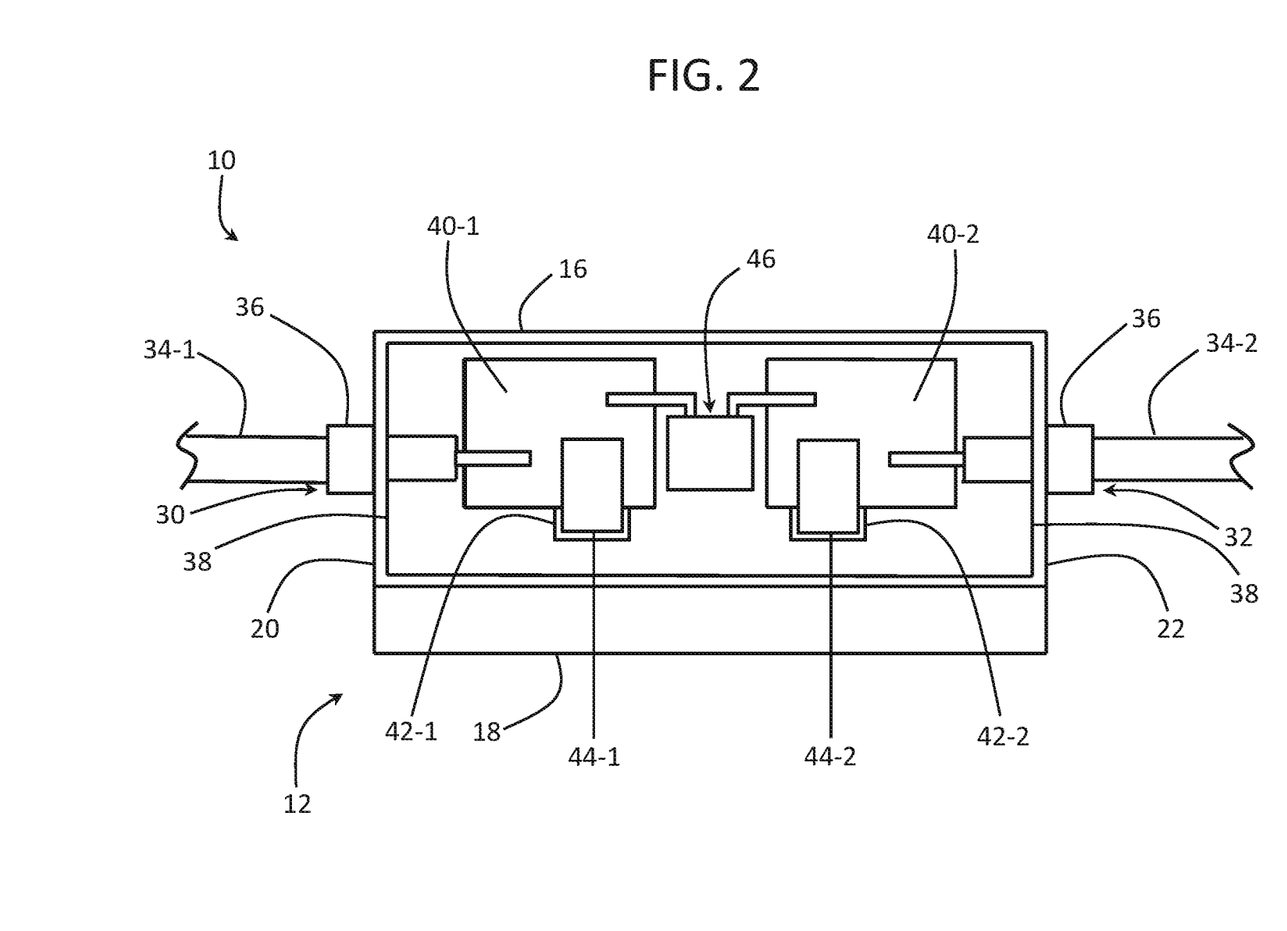

As shown in FIGS. 1 and 2, the end of the cable 34-1 may have at least a portion of its outer insulating layer removed so that the inner conductor may be exposed in the area that the cable 34-1 may overlap the conducting plate 40-1. In this way, the exposed conductor of the cable 34-1 may come into electrical connectivity with the conductor plate 40-1. It may be preferable that the length of insulator removed may be enough to allow for the exposed conductor to make adequate electrical contact with the conducting plate 40-1 while still having at least a portion of the insulator still intact on at least a portion of the cable 34-1 that may extend through the opening 30. The exposed conductor of the cable 34-1 may then be soldered, clamped, or otherwise attached to the conductor plate 40-1 so that the inner conductor 34-1 is held securely in position and in continuous electrical contact with the conducting plate 40-1. It may be preferable that the impedance of the conductor 34-1 and the conductor plate 40-1 be generally matched so that the electrical transmission between the components 34-1, 40-1 may be free of impedance mismatches and electrical obstructions. Similarly, the end of the cable 34-2 may have at least a portion of its outer insulating layer removed so that the inner conductor may be exposed in the area that the cable 34-2 may overlap the conducting plate 40-2. In this way, the exposed conductor of the cable 34-2 may come into electrical connectivity with the conductor plate 40-2. It may be preferable that the length of insulator removed may be enough to allow for the exposed conductor 34-2 to make adequate electrical contact with the conducting plate 40-2 while still having at least a portion of the insulator still intact on at least a portion of the cable 34-2 that may extend through the opening 32. The exposed conductor of the cable 34-2 may then be soldered, clamped, or otherwise attached to the conductor plate 40-2 so that the conductor 34-2 is held securely in position and in continuous electrical contact with the conducting plate 40-2. It may be preferable that the impedance of the conductor 34-2 and the conductor plate 40-2 be generally matched so that the electrical transmission between the components 34-2, 40-2 may be free of impedance mismatches and electrical obstructions.

Figure 3:
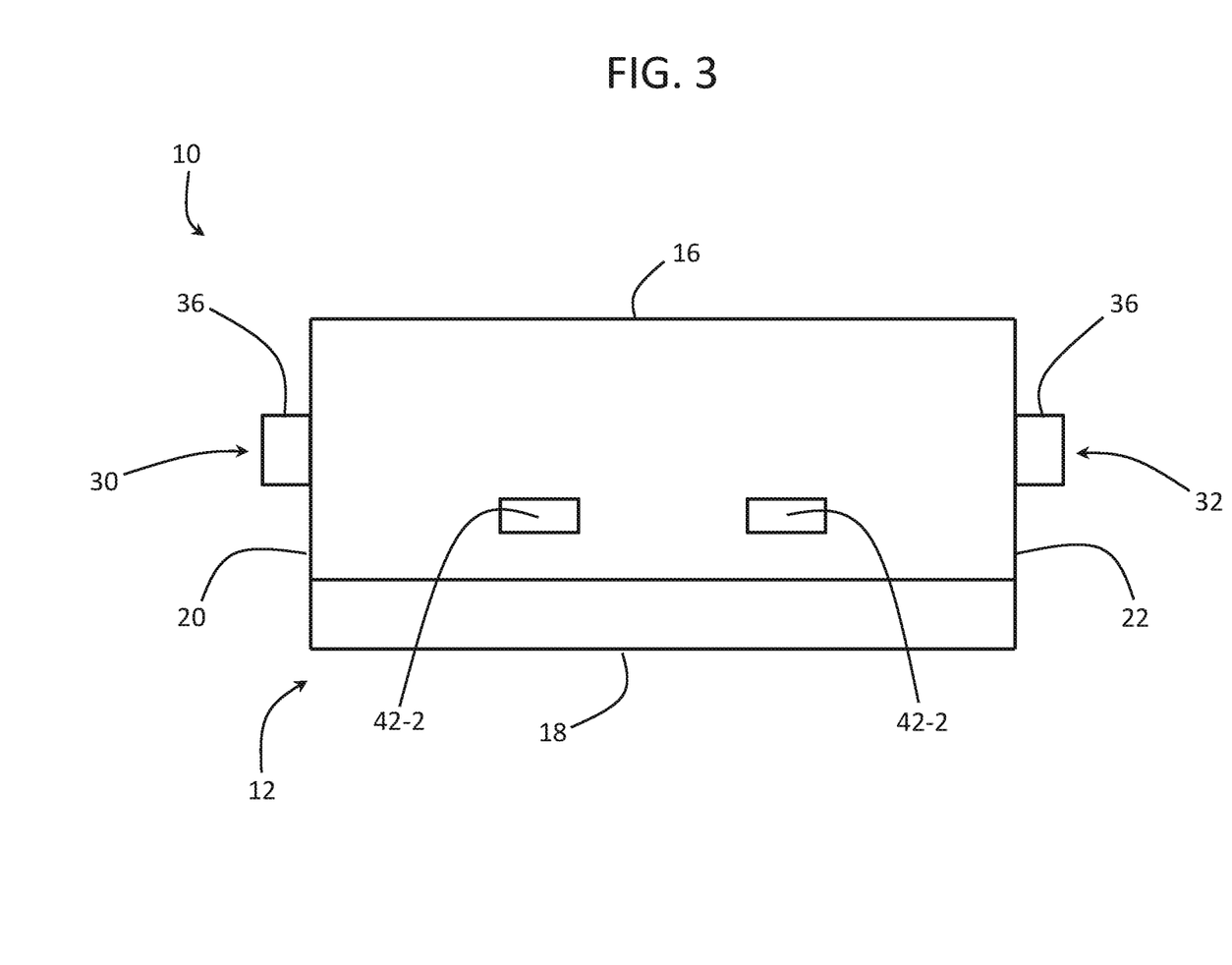

Turning to FIG. 3, the junction box 12 may include at least one opening 42 in the bottom 22 of the enclosure 12. In a preferred embodiment, the junction box 12 may include two openings in the its bottom 22, one opening 42-1 in close proximity to the conducting plate 40-1 and one opening 42-2 in close proximity to the conducting plate 40-2. It may be preferable that the openings 42-1, 42-2 (individually and collectively 42) pass through the bottom 22 of the enclosure 12 such that at a least a portion of the openings 42-1, 42-2 are adjacent to the conductor plates 40-1, 40-2. In this way, tabbing wires 44 may pass through the openings 42 and be electrically connected to the conductor plates 40.

In one exemplary embodiment hereof, the tabbing wire 44-1 may pass through the bottom opening 42-1 and be electrically connected to the conductor plate 40-1. The tabbing wire 44-1 may be soldered, clamped or otherwise attached to the conductor plate 40-1 so that the tabbing 44-1 is held securely in position and in continuous electrical contact with the conducting plate 40-1. Similarly, the tabbing wire 44-2 may pass through the bottom opening 42-2 and be electrically connected to the conductor plate 40-2. The tabbing wire 44-2 may be soldered, clamped or otherwise attached to the conductor plate 40-2 so that the tabbing 44-2 is held securely in position and in continuous electrical contact with the conducting plate 40-2. It may be preferable that the impedance of the tabbing 44-1, 44-2 and the conductor plates 40-1, 40-2 be generally matched respectively so that the electrical transmission between the components 44-1, 44-2 and 40-1, 40-2 respectively may be free of impedance mismatches and electrical obstructions.

The tabbing 44-1 that may be electrically connected to the conducting plate 40-1 and that may pass through the bottom opening 42-1, may extend from the bottom opening 42-1 to an electrical terminal on the solar panel 100. In addition, the tabbing 44-2 that may be electrically connected to the conducting plate 40-2 and that may pass through the bottom opening 42-2, may extend from the bottom opening 42-2 to an electrical terminal on the solar panel 100. In a preferred implementation, the tabbing 44-1 may extend to and be electrically connected to a first terminal on the solar panel 100, and the tabbing 44-2 may extend to and be electrically connected to a second terminal on the solar panel. The tabbing 44-1, 44-2 (individually and collectively) may be electrically connected to the terminals on the solar panel 100 using soldering, clamps or any other attachment mechanisms. The first terminal may be the positive lead (+) of the solar panel 100 and the second terminal may be the negative lead (−) of the solar panel 100. Alternatively, the first terminal may be the negative lead (−) of the solar panel 100 and the second terminal may be the positive lead (+) of the solar panel 100, depending on the orientation of the junction box 12 and the solar panels 100.

With the cable 34-1 electrically connected to the conducting plate 40-1, and the tabbing 44-1 electrically connected to the conducting plate 40-1 and a first terminal on the solar panel 100, the cable 34-1 may be effectively electrically connected to the first terminal on the solar panel 100. In addition, with the cable 34-2 electrically connected to the conducting plate 40-2, and the tabbing 44-2 electrically connected to the conducting plate 40-2 and the second terminal on the solar panel 100, the cable 34-2 may be effectively electrically connected to the second terminal on the solar panel 100.

As shown in FIGS. 1 and 2, the junction box 12 may also include a bypass diode 46. As is known in the art, a diode may generally be a semiconductor device with two terminals (an anode and a cathode) that may allow the flow of electrical current through the device in one direction only (from the anode to the cathode). The bypass diode 46 may be generally positioned in the cavity 28 of the junction box 12 between the conductor plates 40-1 and 40-2, with the anode terminal (the positive (+) terminal) of the diode 46 electrically connected to the conducting plate 40-1, and with the cathode terminal (the negative (−) terminal) of the diode 46 electrically connected to the conducting plate 40-2. Note that the diode 46 may be located in any location within the junction box 12 that may allow it to be electrically connected to the conducting plates 40-1, 40-2 as described above. The anode and the cathode of the diode 46 may be soldered, clamped or otherwise electrically connected to the conducting plates 40-1, 40-2 respectively.

The purpose of the bypass diode 46 may be to electrically bypass a solar panel 100 configured with the junction box 12 in case the solar panel 100 may become damaged or otherwise defective (or possibly shaded). With a set of solar panels 100 configured in series as described above, if one of the solar panels 100 fails, it may cause a break in the series connection between the solar panels 100 and cause an open circuit. If this happens, none of the electricity generated by any of the solar panels 100 in the series may be transferred to the energy storage device.

Accordingly, it may be preferable that the junction box 12 include the bypass diode 46 that may allow for a damaged or otherwise defective solar panel 10 to be electrically bypassed so that an open circuit is not created in the series connection between the panels 100. FIG. 4 shows the resulting electronic schematic that may represent the bypass diode 46 configured with the junction box 12 (depicted in dashed lines) and the solar panel 100 as described above. As shown, if the solar panel 100 of FIG. 4 fails, the diode 46 may complete the circuit from the input 1 to the output 2, thus avoiding an open circuit across the solar panel 100.

Returning to FIG. 1, the back of the junction box 12 may include a notch 48 that may include a back wall 50. The notch 48 and back wall 50 may have dimensions that may allow the junction box 12 to be mounted on the top front of the solar panel 100 as depicted. When configured, the front of the solar panel 100 may generally abut against the back wall 50, and the inner top surface of the notch 48 may generally rest on the top front surface of the solar panel 100. This position may allow for the secure mounting of the junction box 12 to the solar panel 100, and for the electrical terminals of the solar panel 100 to be electrically connected, via tabbing wires 44, to the conducting plates 40 within the junction box 12 as described above. The junction box 12 may be secured to the solar panel 100, or to a slate or other structure or component adjacent to the solar panel 100 using screws, bolts, adhesive, clamps or other attachment mechanisms or combinations of attachment mechanisms. It may be preferable that the junction box 12 be configured with the solar panel 100 in a location that may allow for the tabbing 44-1, 44-2 to extend from the terminals on the solar panel 100 and pass through the openings 42-1, 42-2 respectively and be electrically connected to the conductor plates 40-1, 40-2 respectively. In one preferred implementation, the junction box 12 may be generally configured on the front center surface of the solar panel 100, but any other locations or combinations of locations that allow for the components to be configured as described above are also considered in this specification.

Once all of the components and elements have been configured as described above, potting may be added to the inner cavity 28 of the junction box 12 to seal the electrical connections and components therein and to provide protection from moister, corrosive agents, shock and vibration. The potting may include thermosetting plastics, silicon rubber gels, epoxy, polyurethane or other types of materials. Note that the potting may also be added to the inner cavity 28 of the junction box 12 prior to the deployment of the junction box 12 into the field. In other exemplary embodiments, some of the potting may be added to portions of the cavity 28 prior to the deployment of the junction box 12, and some of the potting may be added to portions of the cavity 28 after the deployment of the junction box 12.

Figure 5:
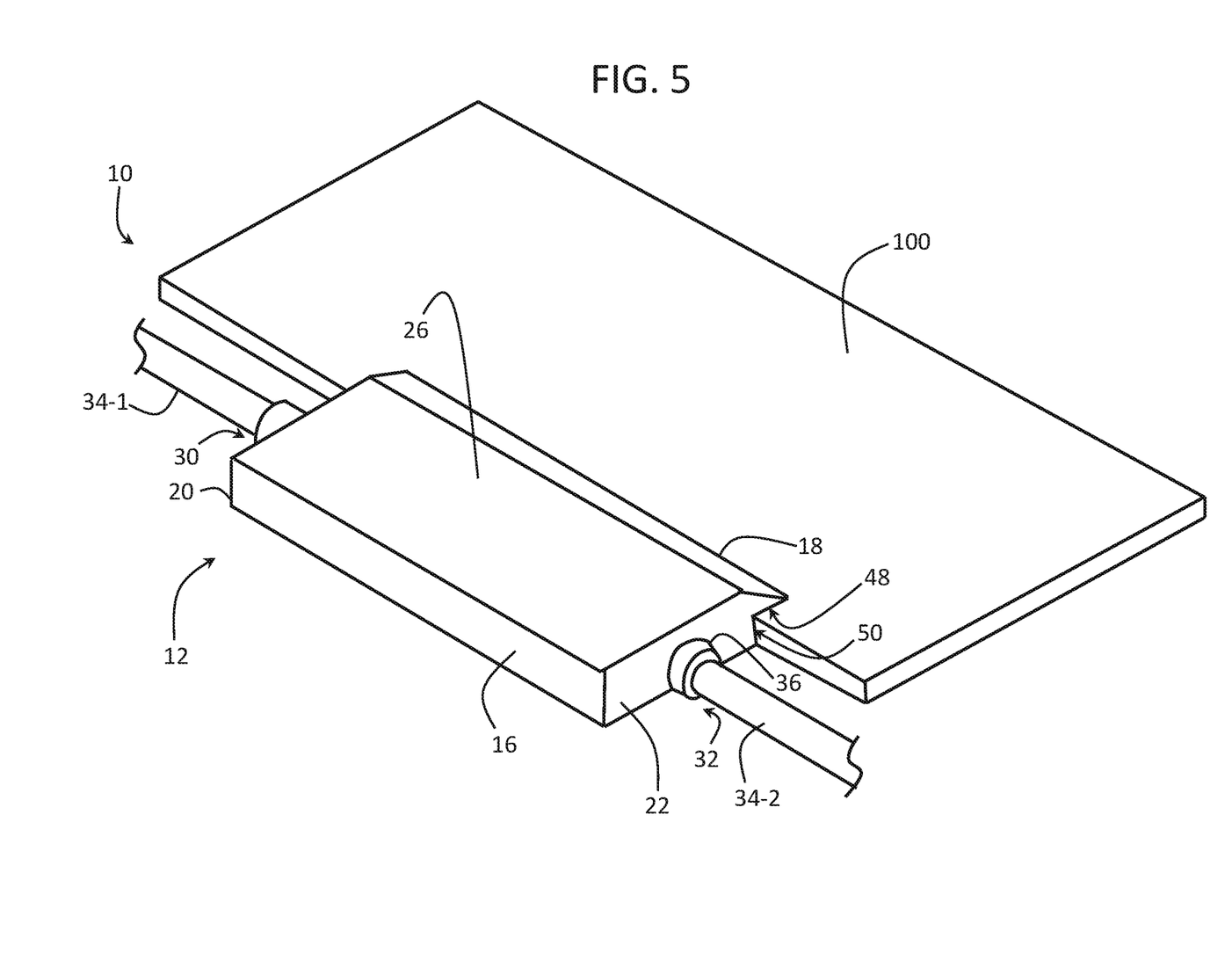
FIG. 5 shows aspects of an assembly according to exemplary embodiments hereof.

As shown in FIG. 5, the top 26 may then be configured to generally cover the top of the junction box 12. It may be preferable that the top 26 fit snug onto the top of the junction box 12 such that there are no gaps or disjoints between the top 26 and the junction box 12. The top 26 may also include cutouts 52 that may receive the protective side shells 36 so that the top 26 may completely enclose the top of the junction box 12 and provide sealed protection to the components within.

Figure 6:
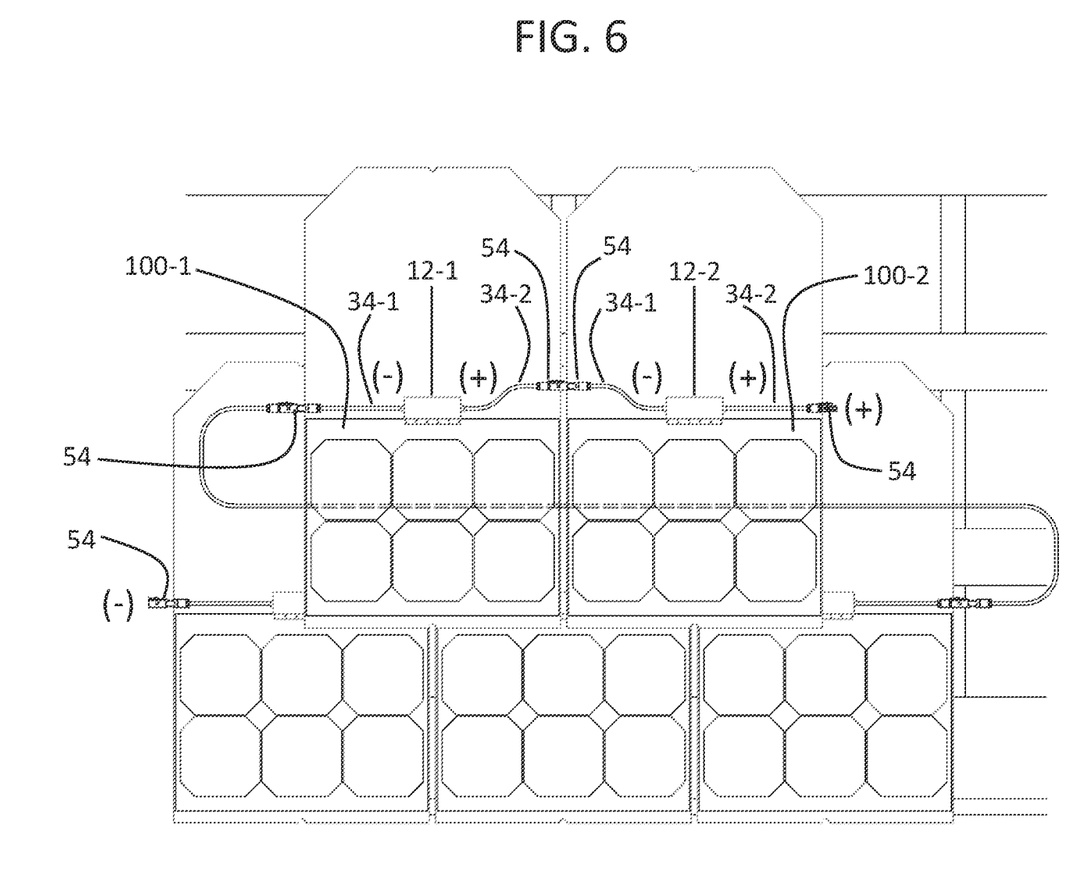
FIG. 6 shows aspects of an assembly configured with equipment according to exemplary embodiments hereof.

FIG. 6 shows a set of solar panels 100 configured in series (electrically), with each solar panel 100 configured with a junction box 12. In a preferred implementation, the solar panels 100 depicted in FIG. 6 may be Sunslate™ solar panels, but other types of solar panels may also be used. As shown, a first solar panel 100-1 may be configured with a first junction box 12-1, a second solar panel 100-2 may be configured with a second junction box 12-2 . . . and an $n^{th}$ solar panel 100-$n$ may be configured with an $n^{th}$ junction box 12-$n$ where n can be any number. The junction boxes 12 may be configured in series as described above such that the junction boxes 12 are electrically connected in series. The positive end (+) of the series of junction boxes 12 may be then connected to the positive terminal (+) of the energy storage device and the negative end (−) of the series of junction boxes 12 may be connected to the negative terminal (−) of the energy storage device. In this way, the energy storage device may collect and store the electrical energy that may be generated by the set of solar panels 100. Note that the leads connecting the series of solar panels 100 to the energy storage device may also include blocking diodes to prevent reverse discharge from the energy storage device.

In use, the junction boxes 12 may be installed as follows:

1. The solar panels 100 may be generally physically installed onto a desired location such as the roof of a building. The solar panels 100 may be installed side-by-side in rows (or in other configurations) using anchor hooks or other types or combinations of types of attachment mechanisms.

2. The junction boxes 12 may be pre-configured with lengths of the cables 34-1 and 34-2 cut and configured with the junction boxes 12 as described above. The lengths of the cables 34-1, 34-2 may be chosen to generally match one-half of the distance between the center points of adjacent solar panels 100 but other lengths may also be used. The end of each length of cable 34-1, 34-2 (i.e. the free end not configured with the junction box) may be configured with a pigtail connector 54 (or any other type of connector) so that the corresponding ends of the adjacent cables 34-1, 34-2 of the adjacent junction boxes 12 may be connected. This is best seen in FIG. 6. Note that the bypass diode 46 may also be pre-installed in the junction box 12.

3. The junction boxes 12 with pre-configured lengths of cables 34-1, 34-2 may be mounted onto the solar panels 100 as described above. The end of the cables 34-1, 34-2 may each include the pigtail connectors 54. In this way, the cables 34-1, 34-2 may be easily attached to the adjacent cables 34-2, 34-1 respectively once the boxes 12 are mounted.

4. The terminals of the solar panels 100 may be electrically connected to the corresponding conductor plates 40-1, 40-2 via tabbing wires 44-1, 44-2 respectively.

5. Once all the connections are made, potting may be added into the cavity 28 of the junction box 12, and the top 26 of the junction box 12 may be applied and sealed.

6. The positive end (+) of the end cable 34-1 may be electrically configured with the positive terminal (+) of the energy storage device, and the negative end (−) of the end cable 34-2 may be electrically configured with the negative terminal (−) of the energy storage device. In this way, electricity generated by the series of solar panels 100 may be collected and stored in the energy storage device.

Note that the steps outlined above are meant for conceptual and demonstration purposes and that the steps may be taken in any order. In addition, other steps may or may not be included. Not all of the steps listed may be necessary, and the scope of the assembly 10 is not limited in any way by the steps taken to install and otherwise use the assembly 100.

The benefits of the junction box 12 include easy installation, easy configuration of the various electrical leads and terminals of the adjacent solar panels 100, the protection of the configured leads, wires, terminals and components, easy replacement, easy maintenance, as well as other benefits.

Where a process is described herein, those of ordinary skill in the art will appreciate that the process may operate without any user intervention. In another embodiment, the process includes some human intervention (e.g., a step is performed by or with the assistance of a human).

As used herein, including in the claims, the phrase "at least some" means "one or more," and includes the case of only one. Thus, e.g., the phrase "at least some ABCs" means "one or more ABCs", and includes the case of only one ABC.

As used herein, including in the claims, term "at least one" should be understood as meaning "one or more", and therefore includes both embodiments that include one or multiple components. Furthermore, dependent claims that refer to independent claims that describe features with "at least one" have the same meaning, both when the feature is referred to as "the" and "the at least one".

As used in this description, the term "portion" means some or all. So, for example, "A portion of X" may include some of "X" or all of "X". In the context of a conversation, the term "portion" means some or all of the conversation.

As used herein, including in the claims, the phrase "using" means "using at least," and is not exclusive. Thus, e.g., the phrase "using X" means "using at least X." Unless specifically stated by use of the word "only", the phrase "using X" does not mean "using only X."

As used herein, including in the claims, the phrase "based on" means "based in part on" or "based, at least in part, on," and is not exclusive. Thus, e.g., the phrase "based on factor X" means "based in part on factor X" or "based, at least in part, on factor X." Unless specifically stated by use of the word "only", the phrase "based on X" does not mean "based only on X."

In general, as used herein, including in the claims, unless the word "only" is specifically used in a phrase, it should not be read into that phrase.

As used herein, including in the claims, the phrase "distinct" means "at least partially distinct." Unless specifically stated, distinct does not mean fully distinct. Thus, e.g., the phrase, "X is distinct from Y" means that "X is at least partially distinct from Y," and does not mean that "X is fully distinct from Y." Thus, as used herein, including in the claims, the phrase "X is distinct from Y" means that X differs from Y in at least some way.

It should be appreciated that the words "first" and "second" in the description and claims are used to distinguish or identify, and not to show a serial or numerical limitation. Similarly, the use of letter or numerical labels (such as "(a)", "(b)", and the like) are used to help distinguish and/or identify, and not to show any serial or numerical limitation or ordering.

As used herein, including in the claims, the terms "multiple" and "plurality" mean "two or more," and include the case of "two." Thus, e.g., the phrase "multiple ABCs," means "two or more ABCs," and includes "two ABCs." Similarly, e.g., the phrase "multiple PQRs," means "two or more PQRs," and includes "two PQRs."

The present invention also covers the exact terms, features, values and ranges, etc. in case these terms, features, values and ranges etc. are used in conjunction with terms such as about, around, generally, substantially, essentially, at least etc. (i.e., "about 3" shall also cover exactly 3 or "substantially constant" shall also cover exactly constant).

As used herein, including in the claims, singular forms of terms are to be construed as also including the plural form and vice versa, unless the context indicates otherwise. Thus, it should be noted that as used herein, the singular forms "a," "an," and "the" include plural references unless the context clearly dictates otherwise.

Throughout the description and claims, the terms "comprise", "including", "having", and "contain" and their variations should be understood as meaning "including but not limited to", and are not intended to exclude other components unless specifically so stated.

It will be appreciated that variations to the embodiments of the invention can be made while still falling within the scope of the invention. Alternative features serving the same, equivalent or similar purpose can replace features disclosed in the specification, unless stated otherwise. Thus, unless stated otherwise, each feature disclosed represents one example of a generic series of equivalent or similar features.

The present invention also covers the exact terms, features, values and ranges, etc. in case these terms, features, values and ranges etc. are used in conjunction with terms such as about, around, generally, substantially, essentially, at least etc. (i.e., "about 3" shall also cover exactly 3 or "substantially constant" shall also cover exactly constant).

Use of exemplary language, such as "for instance", "such as", "for example" ("e.g.,") and the like, is merely intended to better illustrate the invention and does not indicate a limitation on the scope of the invention unless specifically so claimed.

Thus is provided an expandable and flexible shirt elbow section and a shirt with the same.

While the invention has been described in connection with what is presently considered to be the most practical and preferred embodiments, it is to be understood that the invention is not to be limited to the disclosed embodiment, but on the contrary, is intended to cover various modifications and equivalent arrangements included within the spirit and scope of the appended claims.

What is claimed is:

1. An assembly adapted to electrically connect equipment, the assembly comprising:
   a housing including a first side, a second side and a bottom connecting the first and second sides, and at least one opening;
   a first conducting terminal within the housing, and a second conducting terminal within the housing;
   a first conductor passing through the at least one opening and electrically connected to the first conducting terminal;
   a second conductor passing through the at least one opening and electrically connected to the first conducting terminal;
   a third conductor that passes through the at least one opening and electrically connected to the second conducting terminal;
   a fourth conductor that passes through the at least one opening and electrically connected to the second conducting terminal; and
   a cavity defined by the first and second sides and the bottom, and a notch including a back wall opposite the cavity, the back wall adapted to engage an edge of the equipment;
   wherein the second conductor is electrically configured with the equipment, and the fourth conductor is electrically configured with the equipment.

2. The assembly of claim 1 wherein the equipment includes at least one solar panel, and the second conductor is electrically connected to a positive terminal of the at least one solar panel, and the fourth conductor is electrically connected to a negative terminal of the at least one solar panel.

3. The assembly of claim 2 wherein the first conductor and the third conductor are electrically connected to an energy storage device to store energy generated by the at least one solar panel.

4. The assembly of claim 1 further comprising a diode electrically connected between the first and the second conducting terminals.

5. The assembly of claim 1 wherein the second conductor passes through a first opening in the bottom of the housing, and the fourth conductor passes through a second opening in the bottom of the housing.

6. The assembly of claim 1 wherein the back wall extends continuously from the first side to the second side.

7. The assembly of claim 1 wherein the second side is opposite the first side, and the back wall extends continuously from the first side to the second side.

8. The assembly of claim 1 wherein at least a portion of the cavity is laterally adjacent to the edge.

9. The assembly of claim 1 wherein the notch includes an upper wall adapted to overlap at least a portion of the equipment.

10. The assembly of 9 wherein the upper wall extends outward from the back wall.

11. The assembly of 9 wherein the upper wall extends from the first side to the second side.

12. The assembly of 1 wherein a bottom edge of the back wall is adjacent the bottom of the housing.

13. An assembly adapted to electrically connect equipment, the assembly comprising:
    a housing including a first side with a first opening, a second side including a second opening, and a bottom connecting the first and second sides and including third and fourth openings;
    a first conducting terminal within the housing, and a second conducting terminal within the housing;
    a first conductor passing through the first opening and electrically connected to the first conducting terminal;
    a second conductor passing through the third opening and electrically connected to the first conducting terminal;
    a third conductor that passes through the second opening and electrically connected to the second conducting terminal;
    a fourth conductor that passes through the fourth opening and electrically connected to the second conducting terminal;

a diode electrically connected between the first and the second conducting terminals; and a cavity defined by the first and second sides and the bottom, and a notch including a back wall opposite the cavity, the back wall adapted to engage an edge of the equipment;

wherein the second conductor is electrically configured with the equipment, and the fourth conductor is electrically configured with the equipment.

14. The assembly of claim 13 wherein the equipment includes at least one solar panel.

15. The assembly of claim 14 wherein the first conductor and the third conductor are electrically connected to an energy storage device to store energy generated by the at least one solar panel.

16. The assembly of claim 14 wherein the second conductor is electrically connected to the positive terminal of the solar panel, and the fourth conductor is electrically connected to the negative terminal of the solar panel.

17. The assembly of claim 13 wherein the back wall extends continuously from the first side to the second side.

18. The assembly of claim 13 wherein the second side is opposite the first side, and the back wall extends continuously from the first side to the second side.

19. The assembly of claim 13 wherein at least a portion of the cavity is laterally adjacent to the edge.

20. A junction box for use with a solar panel, the junction box comprising:

a housing including a first side including a first opening, a second side opposite the first side and including a second opening, and a bottom connecting the first and second sides and including third and fourth openings;

a cavity defined by the first and second sides and the bottom;

a notch including a back wall opposite the cavity, the back wall adapted to engage an edge of the solar panel and extending continuously from the first side to the second side;

a first conducting plate within the housing, and a second flat conducting plate within the housing;

a first conductor passing through the first opening and electrically connected to the first conducting plate;

a second conductor passing through the second opening and electrically connected to the second conducting plate;

a third conductor passing through the third opening and electrically connected to the first conducting plate;

a fourth conductor passing through the fourth opening and electrically connected to the second conducting plate; and a diode electrically connected between the first and the second conducting plates;

wherein the second conductor is electrically configured with the solar panel, and the fourth conductor is electrically configured with the solar panel.

* * * * *